United States Patent
Chen

(10) Patent No.: US 7,366,040 B2
(45) Date of Patent: Apr. 29, 2008

(54) METHOD OF REDUCING SETTLING TIME IN FLASH MEMORIES AND IMPROVED FLASH MEMORY

(75) Inventor: Chung-Zen Chen, Hsinchu (TW)

(73) Assignee: Elite Semicondutor Memory Technology, Inc., Hsinchu (TW)

( * ) Notice: Subject to any disclaimer, the term of this patent is extended or adjusted under 35 U.S.C. 154(b) by 138 days.

(21) Appl. No.: 11/261,335

(22) Filed: Oct. 28, 2005

(65) Prior Publication Data

US 2007/0097759 A1   May 3, 2007

(51) Int. Cl.
*G11C 7/00* (2006.01)
(52) U.S. Cl. .................. 365/194; 365/158; 365/189.09
(58) Field of Classification Search ................ 365/194, 365/158, 189.09, 185.17, 185.28, 185.23
See application file for complete search history.

(56) References Cited

U.S. PATENT DOCUMENTS

| | | |
|---|---|---|
| 6,175,605 B1 | 1/2001 | Chi |
| 6,291,297 B1 | 9/2001 | Chen |
| 2004/0032759 A1* | 2/2004 | Chow et al. ................. 365/145 |
| 2005/0213385 A1* | 9/2005 | Hosono et al. ........ 365/185.17 |
| 2006/0018162 A1* | 1/2006 | Kawai .................... 365/185.28 |
| 2006/0023497 A1* | 2/2006 | Kawazoe et al. ........... 365/158 |

OTHER PUBLICATIONS

Chen-Yuan Hsu et al., "Spit-Gate NAND Flash Memory at 120 NM Technology Node Featuring Fast Programming and Erase," 2004 Symposium on VLSI Technology Digest of Technical Papers, 0-7808-8289-7/04 © 2004 IEEE, pp. 78-79.

* cited by examiner

*Primary Examiner*—Richard T. Elms
*Assistant Examiner*—Dang Nguyen
(74) *Attorney, Agent, or Firm*—Duane Morris LLP

(57) ABSTRACT

A method of biasing word lines in a flash memory array wherein a selected word line is selected for a reading operation during data access includes the steps of biasing deselected word lines with a deselected word line voltage, delaying for a delay period and after the delay period, biasing the selected word line with a selected word line voltage for performing the reading operation.

16 Claims, 7 Drawing Sheets

METHOD OF REDUCING SETTLING TIME IN FLASH MEMORIES AND IMPROVED FLASH MEMORY

FIELD OF THE INVENTION

The present invention generally relates to flash memory devices and to methods of reading data therefrom.

BACKGROUND OF THE INVENTION

NAND type EEPROMs (Electrically Erasable Programmable Read Only Memories) or flash memories have been developed for solid-state mass storage applications for portable music players, mobile telephones, digital cameras, and the like, as well as have been considered as a replacement for hard disk drives (HDDs).

The narrow, long polysilicon word lines of the flash array have long RC delays associated therewith which must be considered when reading data from the array. Parasitic and word line to word line capacitances contribute to the RC delay, as a selected word line is initially coupled up to the higher voltage of adjacent deselected word lines, meaning accurate reading cannot occur until the selected word line dissipates the coupled voltage. Coupling becomes particularly strong between closely spaced word lines. Coupling between the select gate of the selected word line and the adjacent word line can also contribute to this delay in split gate flash cells, such as described in, for example, U.S. Pat. No. 6,291,297 to Chen (US '297), the entirety of which is hereby incorporated by reference herein.

As mentioned, these RC delays contribute to the total access time required to read data from flash memory cells. Typically, the access time is around 10 μs for memory cell densities below 512 Mb and around 25 μs for densities above 1 Gb. Although, conceptually at least, metal shunts can be used to reduce the RC delay, their use is generally not preferred because of the additional costs associated therewith and the difficulty in providing the shunt metal in such narrow pitches.

Therefore, there remains a need for an improved flash memory with improved reading times and method of reading data from a flash memory.

SUMMARY OF THE INVENTION

A method of biasing word lines in a flash memory array wherein a selected word line is selected for a reading operation during data access includes the steps of biasing deselected word lines with a deselected word line voltage, delaying for a delay period and after the delay period, biasing the selected word line with a selected word line voltage for performing the reading operation.

A flash memory device is also provided. The flash memory device includes at least one memory block comprising a plurality of word lines and biasing circuitry for biasing the word lines with a deselected word line voltage for deselected word lines and a selected word line with a selected word line voltage for performing a reading operation, wherein during a reading operation the selected word line is biased with the selected word line voltage after a delay period from when the deselected word lines are biased with the deselected word line voltage.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
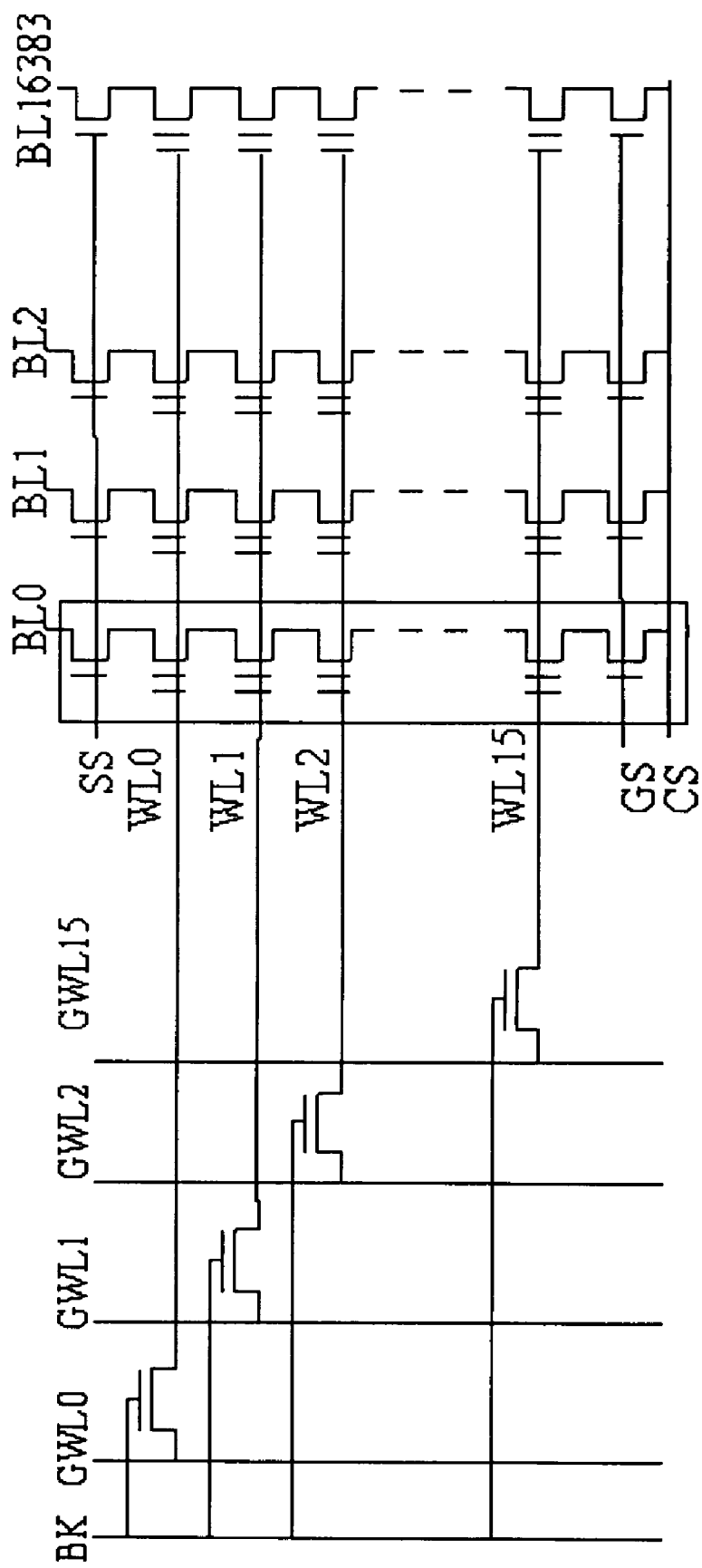
FIG. 1 is circuit diagram of a portion of a flash memory having a plurality of NAND memory cells.

Referring to FIG. 1, an electrically erasable programmable read-only memory is shown comprising an array of memory cells, which is formed on a chip substrate. As will be recognized by those in the art, FIG. 1 is a circuit diagram of a portion of a NAND flash memory array. Various components, such as column and row decoders, sense circuitry and other control circuitry are not shown so as to avoid obscuring the disclosure of the present invention. These components, however, are familiar to those in the art.

An exemplary memory array is partitioned into many memory "blocks." Each block has several "pages." A page has many memory "cells." For example, a 1 Gb memory has 1024 blocks, and one block has 64 pages. Each page has 2K bytes of bits (i.e., 16K bits). A word line contains a page or multiple pages. A cell string or two cell strings are provided per block in the bit line direction. A cell string has 16 bits, 32 bits or 64 bits.

The illustrated memory array of FIG. 1 includes a plurality of parallel bit lines BL0, BL1, . . . through BL16383 in the illustrated embodiment coupled to memory cells defined at intersections of individual bit lines and word lines of the memory array. In a preferred embodiment, the individual cells are floating gate flash cells, although other cell structures, such as SONOS or split gate flash cells, are contemplated. Parallel word lines WL0, WL1, WL2 . . . WL15 are insulatingly formed over the substrate so as to form control gates for the individual flash memory cells. Selection transistors are associated with each bit line and are coupled to signals SS and GS.

Block select signal BK is used to select a block of memory cells. CS designates the common source line. A cell string is connected to a bit line through SS selection transistor on one side and to CS through the GS transistor. Global word line signals GWL0, GWL1, . . . through GWL15 bias word lines WL0 to WL15, respectively, through respective word line driving transistors during data access.

Different kinds of memory cells have different conditions for reading stored data. Generally though, the selected word line, i.e., the word line from which data is to be read, is biased at a voltage less than the voltage used to bias the neighboring deselected word lines. The higher bias of the neighboring deselected word lines can be coupled to the selected word line though, and must be dissipated before accurate reading can occur from the selected word line.

Figure 2:
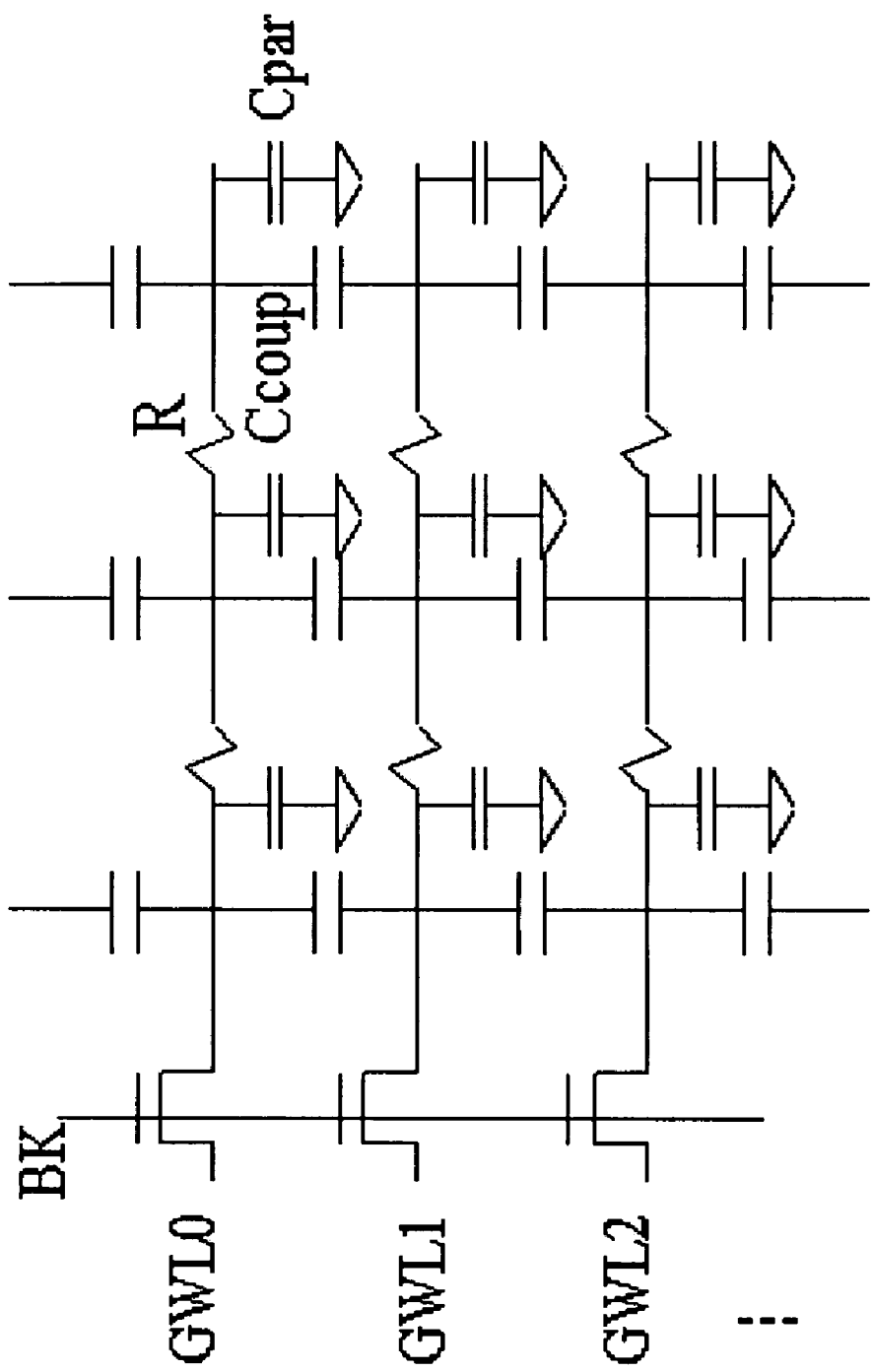
FIG. 2 is an illustration of the capacitances and resistances inherent in a flash memory of FIG. 1.

FIG. 2 shows the word line resistance-capacitance model for the flash array of FIG. 1. Specifically, FIG. 2 shows word line to word line coupling capacitances (Ccoup), other parasitic capacitances (Cpar) and word line resistances (R). For a 0.13 μm transistor generation, i.e., for transistors having channel lengths of 0.13 μm, the following conditions may be present:

(i) word line to word line coupling capacitance (Ccoup): 0.096 fF/cell;
(ii) parasitic capacitance (Cpar) in a word line: 0.064 fF/cell;
(iii) total word line to word line coupling capacitance (16384 cells): 1.57 pF;
(iv) total parasitic capacitance: 1.05 pF;
(v) word line width: 0.13 μm;
(vi) word line length (16×1024×2×0.13 μm): 4259 μm;
(vii) word line resistance (4259 μm/0.13 μm×60): ≈2×10$^6$ Ω, assuming the word line is made of n+polysilicon and its sheet resistance is 60 ohm; and
(viii) word line RC (1.57 pF+1.05 pF)×2×10$^6$ Ω: 5 μs.

In one method of reading conventional floating gate flash cells, the word line voltage of the selected word line is set to 0V, to distinguish the program state (with threshold voltage above 1V) or erased state (with threshold voltage below −1V). The deselected word lines are set to a higher voltage, such as 4V. Voltage from the higher biased deselected word lines couples to the selected word line and must be dissipated before reading can occur. Therefore, sufficient margin must be provided during the reading cycle to account for this settling time.

Likewise, appropriate margins must also be provided during reading other cell structures, such as the split gate cells of US '297. During reading of these split gate cells, the select gate of all of the memory cells is biased at around 4.5V to act as pass transistors. The selected word line is biased at 1.5V and the deselected word lines are biased at 9V. Each word line has a select gate on both sides thereof. The 4.5V on the select gate and the 9V on the nearby deselected word lines couple to the selected word line. In the cell structure, the space between the word line and the select gate is very narrow, for example an ONO layer with 140 Å effective oxide thickness. For this reason, the coupling between the selected word line and the select gate is particularly strong. This large coupling capacitance causes an increased settling time and attributes to the amount of access time required for reading.

Figure 3:
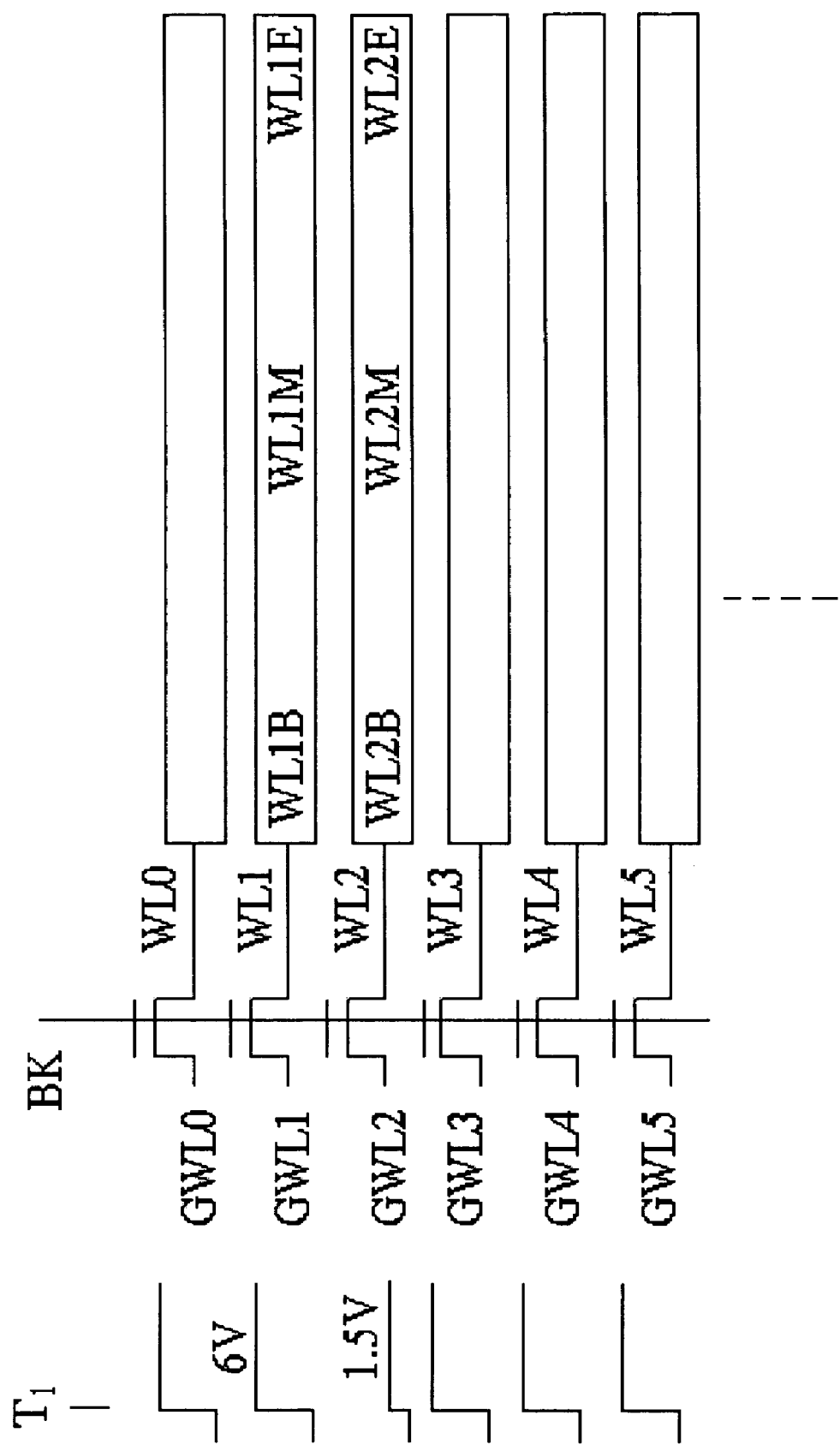
FIG. 3 is an illustration of a prior art reading condition for a flash memory device.

FIG. 3 generally illustrates this prior art reading operation signal timing as well as labels various nodes along the word lines of a selected block memory block for later referral, i.e., WL1B refers to the beginning portion of polysilicon word line WL1 most proximate to the driving transistor, WL1M refers to the middle portions of polysilicon word line WL1, WL1E refers to the end portion of polysilicon word line WL1, WL2B refers to the beginning portion of polysilicon WL2 word line, WL2M refers to the middle portion of polysilicon word line WL2, WL2E refers to the end portion of polysilicon word line WL2, etc. For ease of illustration, only six word lines are illustrated. Assume at time T1 corresponding to the beginning of the read operation that deselected word lines are biased at 6V during reading and selected word lines are biased at 1.5V. In FIG. 3, WL2 is selected for reading and WL0, WL1 and WL3 to WL5 are deselected. Each word line is turned on at the same time via block selection signal BK through its respective word line selection transistor. The deselected word lines WL0, WL1 and WL3 to WL5 in the string are biased at the high voltage, such as 6V. This 6V bias couples to the selected word line WL2 from adjacent deselected word lines WL1 and WL3, causing a spike in the voltage along selected word line WL2. Extra time is allotted in the reading cycle to wait for WL2 to settle to its 1.5V bias before reading is attempted. This extra time provides enough margin to allow for dissipation of the coupled voltage so as to allow accurate determination (i.e., reading) of whether the read cell is in a programmed or erased state.

Figure 4:
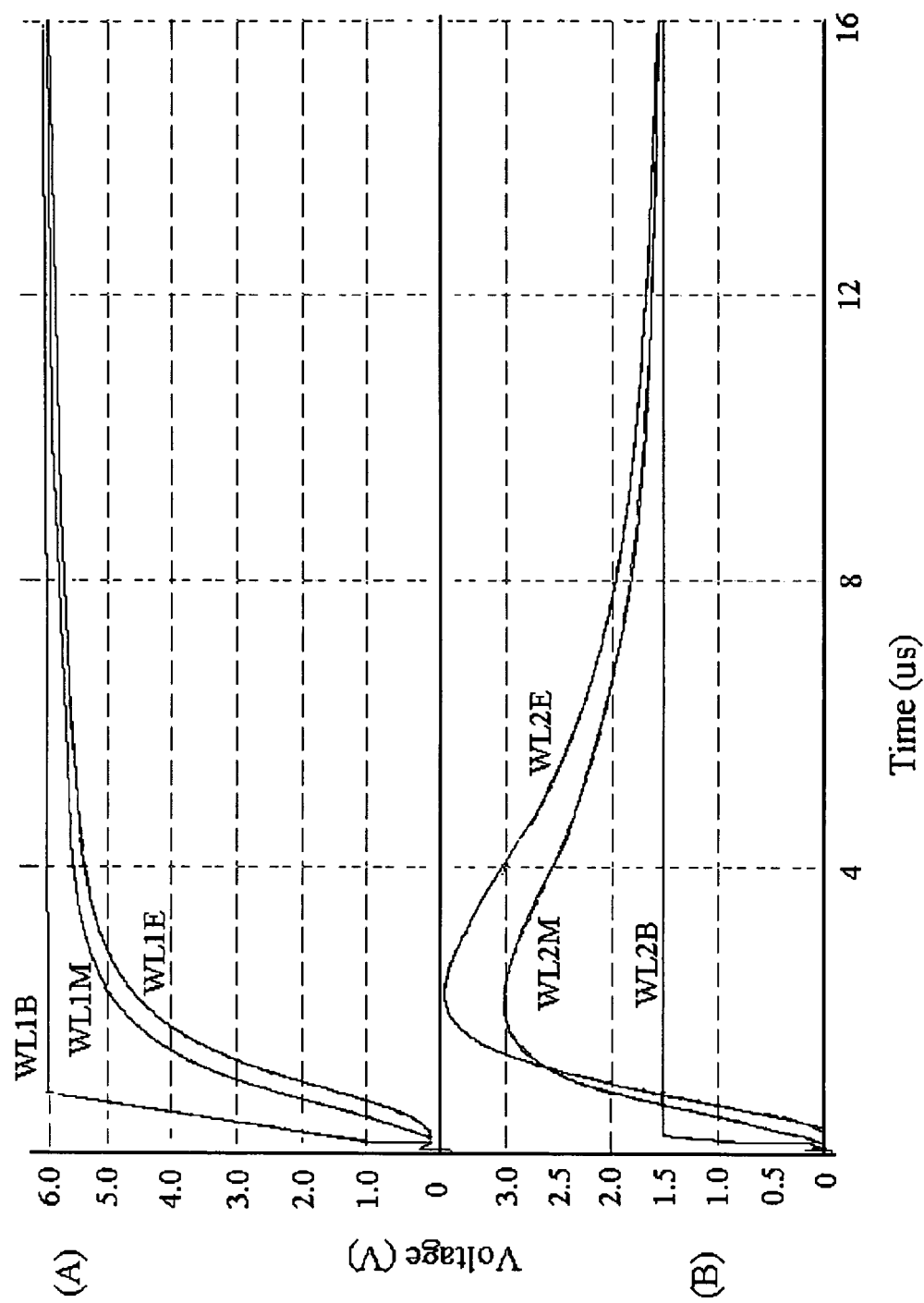
FIG. 4 is a graph of a simulation using the reading conditions of FIG. 3 showing the settling time of various nodes along a selected word line.

A simulation illustrates the affect of this undesired coupling on the settling time of the selected word line. FIG. 4 is a plot showing the affect of the coupling voltage on the settling time of the selected word line WL2. The polysilicon word lines were assumed to be spaced from each other with narrow 200 Å $SiO_2$ spacers. Word line thickness was set at 0.2 μm and gate length was set at 0.13 μm. Each word line has 2048 byte cells or 32K F length, where F is the minimum dimension that can be photolithographically defined in the manufacturing process used to make the memory array, e.g., 0.13 μm. The bit line pitch (i.e., bit line width plus bit line to bit line spacing) is 0.26 μm (i.e., 2 F) and thus the word line length is 4259 μm. The resistance of the word line is about 2 MΩ. The word line to word line coupling capacitance is 0.096 fF per cell on each side. The other parasitic capacitance is about 0.064 fF per cell.

As can be seen from plot portion A of FIG. 4, deselected word line (WL1) is biased to a high voltage, such as 6 volts for purposes of the simulation. Node WL1B quickly rises to this high voltage, with end node (WL1E) and middle node (WL1M) of WL1 exhibiting some delay in reaching the high bias voltage. As shown in plot portion B of FIG. 4, selected word line WL2 is biased to a lower voltage, here 1.5 volts, at the same time deselected WL1 is biased to the high voltage. The voltage at the beginning node WL2B of WL2 quickly steadies at 1.5V, as it is most proximate to the word line driver transistor. The voltage at the middle node (WL2M) of the word line, however, initially jumps to about 3V due to voltage coupling from the high voltage of the neighboring deselected word lines (e.g., WL1) and decays slowly, over about 16 μs, to the 1.5V bias voltage of the selected word line. Likewise, the voltage at the end node (WL2E) of the selected word line initially jumps to about 3.6V and takes a similar amount of time to settle to the 1.5V selected word line bias.

Figure 5:
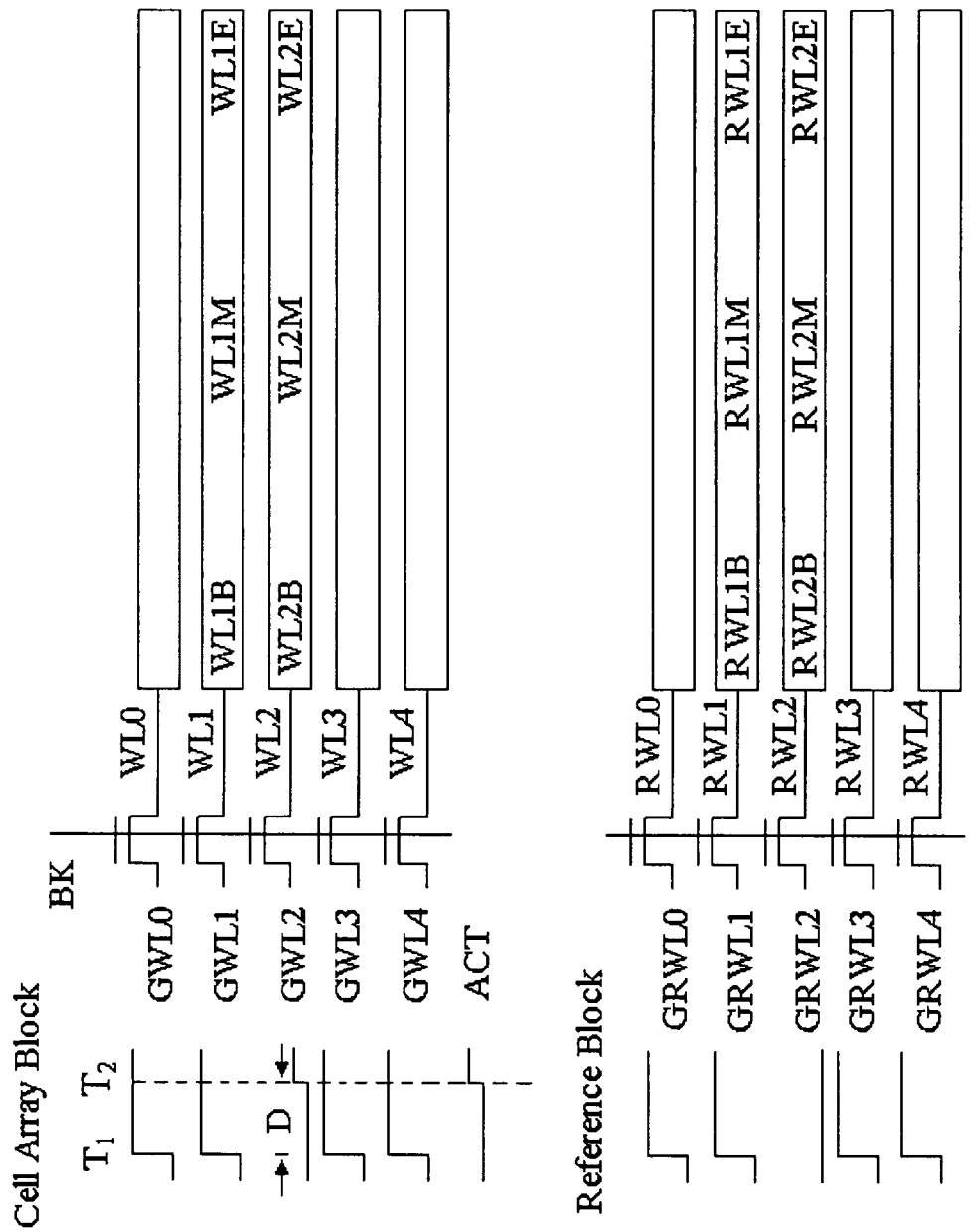
FIG. 5 illustrates an embodiment of the new reading condition for a flash memory device according to the present invention.

A new method of reading flash cells is proposed that reduces the settling time of the selected word line. The reading method is applicable to various flash cells, such as floating gate, split gate, SONOS, etc., which experience settling times that add to the time margin required for reading data from the cells. FIG. 5 illustrates portions of the new flash memory and the timing thereof.

The new flash memory array includes a reference block of memory cells having a plurality of reference word lines manufactured in the same manner, and thus having the same characteristics (e.g., coupling capacitances, parasitic capacitances and resistances) as the cell array block. Although only five word lines are shown in the cell array block, it should be understood that an exemplary block include sixteen word lines, as shown in FIG. 1. Also, although the reference block is shown as including five word lines, sufficient numbers of word lines should be included so as to accurately reflect the coupling and parasitic capacitances of the cell array block. This number necessarily need not be the same number of word lines as is provided in the cell array block, but rather may be fewer, such as between nine and eleven word lines in an exemplary embodiment.

As described hereafter, the reference block is used to provide a voltage that tracks the decay of the coupling voltage in a selected word line (i.e., selected for reading) for comparison to a reference voltage. The comparison results are used to trigger the turn on of the reading voltage to the selected word line. Although the decay could be monitored directly from the selected word line, as opposed to providing a reference block, this is not preferred as it would require connections between each word line in each memory block to comparison circuitry rather than merely from the reference block.

A word line from the memory cell array is selected, such as WL2 of the cell array block, for reading. A word line is also selected or designated from the reference block, such as RWL2. During operation, this reference word line RWL2 biased at a lower voltage 0V, as compared to the 1.5V (or other selected word line reading voltage) of the selected word line of the prior art described above, and the remaining deselected reference word lines are biased at 6V (or other deselected word line voltage), as with the deselected word lines of the prior art described above in connection with FIG. 4. The deselected word lines of the cell array block (i.e., WL0, WL1, WL3, WL4, etc.) are biased with the same voltage as the deselected reference word lines, i.e. 6V. Rather than being initially biased with the selected word line reading voltage (e.g., 1.5V), the selected word line WL2 of the cell array block is initially biased at a voltage lower than the selected word line reading voltage, such as 0V, for an initial delay period (designated "D"). At this time, the voltage of the reference word line RWL2 is coupled up by the neighboring deselected reference word lines, which are pulled to 6V as described above. The selected word line WL2 is likewise coupled up by the high voltage coupled to the neighboring word lines.

Figure 6:
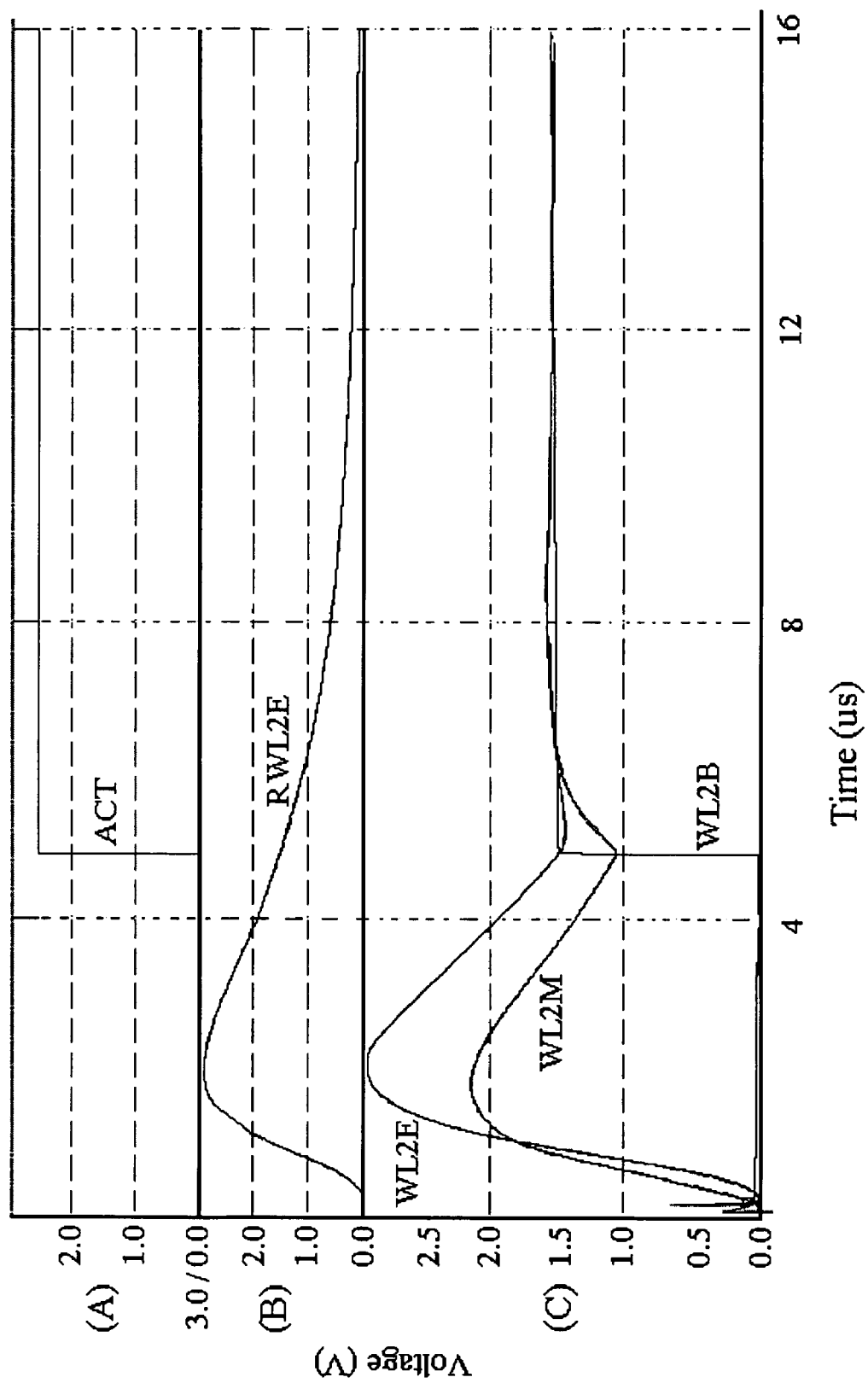
FIG. 6 is a graph of a simulation using the reading conditions of FIG. 5 showing the settling time of various nodes along a selected word line and a selected reference word line.

After the voltage at the selected reference word line RWL2 peaks, it decays the coupled voltage towards 0V, i.e., the ground voltage applied to RWL2. A similar decay occurs in the selected word line WL2, as the word line array blocks are similarly constructed and biased. Since the power of the selected word line WL2 is 0V during this time (as opposed to 1.5V with the prior art), its farthest node (WL2E) is only coupled to a peak value of 2.9V (as seen in FIG. 6) as with the farthest node (RWL2E) of the reference word line, which is lower than the 3.6V described above in connection with FIG. 4.

The new reading method was tested by way of simulation on the cell structure used in generating the simulation results of FIG. 4. The results are shown in FIG. 6. Plot portion (B) of FIG. 6 shows the voltage at RWL2E coupling to a peak of about 2.9V and then decaying towards 0V. As the RWL2E voltage nears or reaches 1.5V, the voltage bias for a selected word line in this embodiment, a control signal ACT (shown in plot portion (A)) is generated to trigger the biasing of the selected word line WL2 with the selected word line reading voltage, i.e., to switch the voltage bias from 0V to 1.5V. The voltage switch at WL2 is shown in plot portion (C) of FIG. 6 responsive to control signal ACT.

In practice, the ACT signal is used as a control signal to control the GWL voltage level, i.e., to switch GWL selected word line reading voltage from, for example, 0V to 1.5V, in ways that should be familiar to those in the art.

In this reading method, a lower voltage, e.g., 0V, rather than the selected word line bias voltage, e.g., 1.5V, is used to bias the selected word line during a first delay period of time D (from time T1 until time T2 in FIG. 5), thereby helping to speed the decay of the coupled voltage along the selected word line, and particularly at its farthest node WL2E. It will be understood that in the illustrated embodiment, node WL2E takes the longest time to dissipate the coupled voltage and thus dictates the time period during which reading should not occur. The switch of power after this delay period from 0V to 1.5V on the selected word line pulls the beginning node WL2B of the selected word line quickly to the desired voltage. The voltage at node WL2M also quickly increases to the 1.5V bias voltage as the voltage at node WL2E settles at the bias voltage.

Plot portion (C) of FIG. 6 shows that all nodes of the selected word line WL2, i.e., beginning node WL2B, middle note WL2M, and end nodes WL2E, quickly settle at the desired 1.5V selected word line bias voltage. In this simulation, all nodes have settled to 1.5V after about 7 μs, as compared to the 16 μs shown through the simulation of FIG. 4. Essentially, by delaying the biasing of the selected word line for a period of time until the coupled voltage along the word line can decay or substantially decay, particularly near the end node of the selected word line, until when the difference between the selected word line bias voltage and the node voltage is smaller (or 0V), the settling time is increased. This quicker settling time greatly reduces the access window needed for reading the memory cells of a selected word line.

Figure 7:
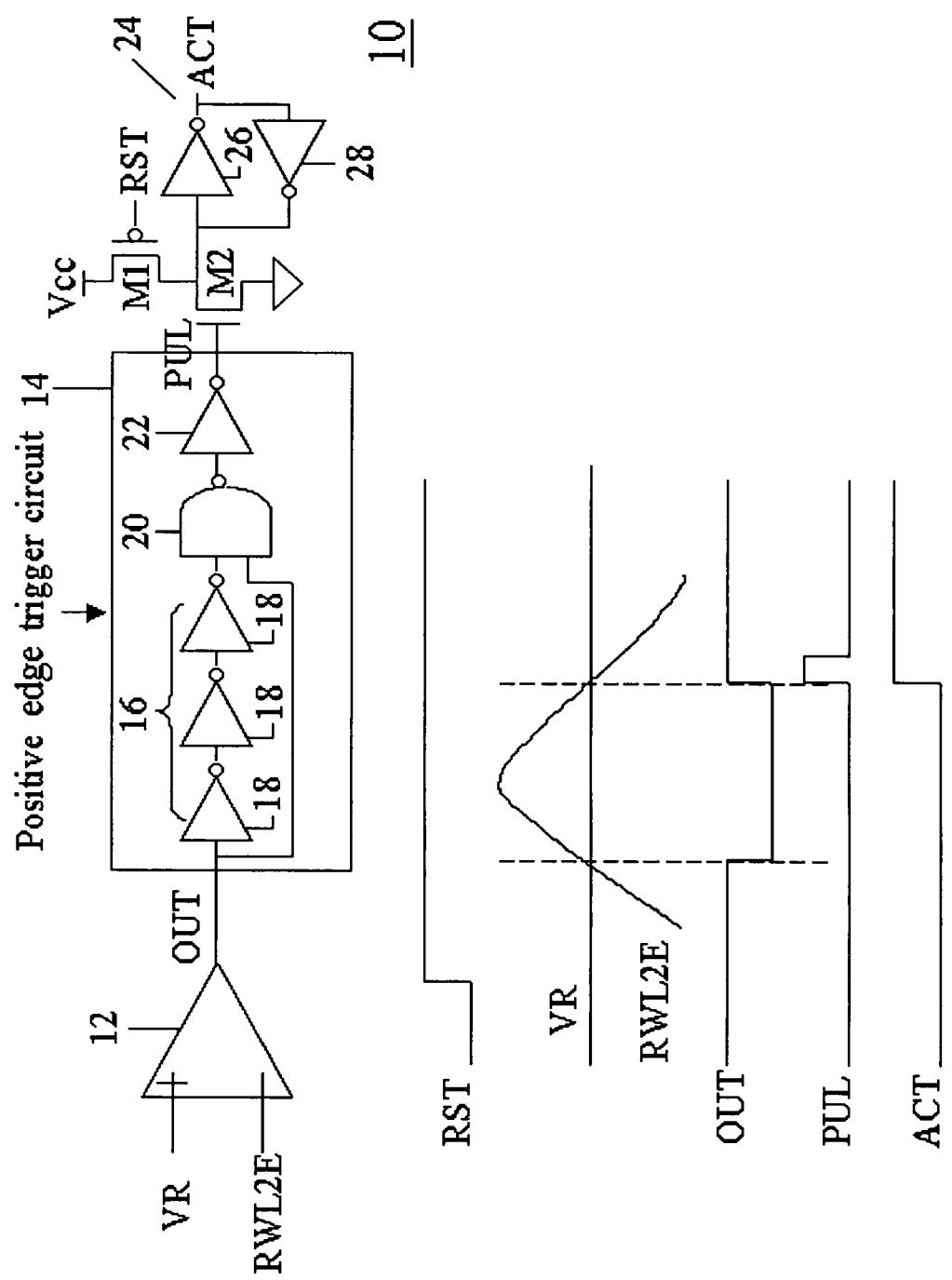
FIG. 7 is circuit diagram of an embodiment of a control signal generation circuit.

FIG. 7 shows an embodiment of an exemplary circuit 10 for generating the control signal ACT. FIG. 7 also shows a timing diagram for the circuit. ACT is normally set low by reset signal RST coupled to PMOS transistor M1, which is coupled between power supply voltage Vcc and NMOS transistor M2. The circuit includes a comparator 12 with inputs coupled to reference voltage VR and to the voltage at node RWL2E. VR can be set to 1.5V, or another trigger voltage between the two bias voltages (i.e., between the selected word line bias voltage and unselected word line bias voltage), and more preferably less than the expected peak voltage on the selected word line and still more preferably at about the selected word line bias voltage. At the beginning, the voltage at RWL2E is 0V. Under these conditions, the output of the comparator 12 (OUT) is high. The output of the comparator 12 is coupled to a positive edge (or rising edge) trigger circuit 14 having an output PUL. Output PUL is low initially. As shown in the timing diagram of FIG. 7, RWL2E is coupled up above VR by the coupling with its neighboring deselected reference word lines, or other voltages present in the array. When RWL2E is above VR, output signal OUT becomes low. The positive edge trigger circuit maintains PUL low while OUT is low. Once RWL2E discharges from above 1.5V to reference voltage VR, signal OUT again goes high. This second switch in OUT triggers a PUL pulse that sets ACT to high.

In one embodiment, the positive edge trigger circuit 14 includes a delay chain 16 including a plurality of delay elements, such as an odd number of cascaded inverters 18. The positive edge trigger circuit 14 also includes a NAND gate 20 having a first input coupled to receive the output of the delay chain 16 and a second input coupled to receive signal OUT. In operation, NAND 20 generates a low output signal except for when both inputs are high. Signal PUL from inverter 22, therefore, is only high for periods when NAND 20 generates a low output. The inputs to NAND 20 are both high only after signal OUT switches from low to high and for the time it takes low signal OUT to proceed through delay element 16. In an exemplary embodiment, the delay is about 2 ns.

The output of the NAND gate 20 is coupled to an inverter 22, which provides signal PUL to NMOS transistor M2, which in turn passes signal PUL to the latching circuit 24 when transistor M2 is on, i.e., when PUL is high and RST is high.

In one embodiment, latching circuit 24 comprises a pair of inverters 26, 28, with the output of inverter 26 coupled to the input of inverter 28 and the output of inverter 28 coupled to the input of inverter 26. The latch circuit 24 is configured to capture and retain the activated output of the positive edge trigger circuit 14 for subsequent use as described above.

After reading, a new command will be input (i.e., read, write, or erase command). When the new command is input, RST is activated to reset the ACT signal.

The reading method is most effective in flash arrays that utilize only a single driver transistor, which is usually placed proximate to the beginning node WLB, of the word line. If one driving transistor is present, the voltage at the node that takes the longest time to dissipate the coupled voltage preferably is monitored. Typically, this node will be the node most distal from the driving transistor. If two driver transistors are utilized, one at each end of the respective word lines, the voltage of the word line will stabilize more quickly. Use of more than one driver transistor often is not desired, however, for size, cost, complexity and/or power considerations. Even were the flash array to utilize two driver transistors per word line, however, the methodology described herein could be utilized to further improve the settling time. In this embodiment, the middle node of the selected word line preferably is used as an input to the comparator 12 of the control signal generation circuit 10.

Although the improved reading method has been described above in connection with a reading protocol where the bias is set to a positive voltage, such as 1.5V, at the selected word line and a higher voltage, such as 6V, at the deselected word line, the method is not so limited. For example, for a standard floating gate flash cell, where the reading condition is 0V at the selected word line and 4V at the deselected word line, the selected word line could initially be biased to some negative voltage until signal ACT is triggered, such as when a reference word line decays to 0V. Reference voltage VR of the circuit of FIG. 7 is set accordingly.

Although the new reading method has been described above with reference to reading conditions for a specific kind of flash cell, those in the art should appreciate that the method is generally applicable to any flash cell structure which exhibits strong word line to word line coupling and where the selected word line has a different bias voltage than the deselected word line bias voltage.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention

What is claimed is:

1. A method of biasing word lines in a flash memory array wherein a selected word line is selected for a reading operation during data access, the method comprising the steps of:
    biasing deselected word lines with a deselected word line voltage;
    providing a reference array of memory cells comprising a plurality of reference word lines;
    biasing deselected reference word lines with said deselected word line voltage;
    waiting for voltage at a node on a selected reference word line to fall to a reference voltage; and
    after said node voltage reaches said reference voltage, generating a control signal for triggering biasing said selected word line with a selected word line voltage; and
    biasing said selected word line with said selected word line voltage for performing said reading operation.

2. The method of claim 1, wherein said deselected word line voltage is greater than said selected word line voltage for performing said reading operation.

3. The method of claim 1, wherein said control signal generating step comprises:
    comparing said reference word line voltage with said reference voltage;
    providing results of said comparison to a positive edge trigger circuit; and
    latching an output of said positive edge trigger circuit.

4. The method of claim 1, wherein said selected reference word line is driven by a driving transistor and wherein said node is distal from said driving transistor, said method further comprising the step of comparing said node voltage to said reference voltage.

5. The method of claim 1, wherein said selected reference word line and selected word line are maintained at a voltage below said reference voltage during said waiting step.

6. The method of claim 1, wherein voltage from at least some of said deselected word lines couples to said selected word line, wherein said coupled voltage at said selected word line falls to said reference voltage during said waiting step.

7. A flash memory device comprising:
    at least one memory block comprising a plurality of word lines; and
    biasing circuitry for biasing said word lines with a deselected word line voltage for deselected word lines and a selected word line with a selected word line voltage for performing a reading operation, wherein during said reading operation said selected word line is biased with said selected word line voltage after a delay period from when said deselected word lines are biased with said deselected word line voltage,
    wherein voltage from at least some of said deselected word lines couples to said selected word line and wherein said delay period corresponds to a time it takes for said coupled voltage at said selected word line to fall to a reference voltage.

8. The memory device of claim 7, further comprising means for generating a control signal for triggering biasing said selected word line after said delay period.

9. The memory device of claim 8, wherein said deselected word line voltage is greater than said selected word line bias voltage.

10. The memory device of claim 8, wherein said control signal generating means comprises:
    a comparator for comparing a reference voltage and a detected voltage;
    a positive edge trigger circuit responsive to an output of said comparator; and
    a latching circuit responsive to an output of said positive edge trigger circuit.

11. The memory device of 10, further comprising a reference memory block comprising a plurality of reference word lines, wherein said control signal generating means is responsive to a voltage detected from said reference memory block.

12. A method of biasing word lines in a flash memory array wherein a selected word line is selected for a reading operation during data access, the method comprising the step of:

biasing deselected word lines with a deselected word line voltage;

biasing said selected word line at a first voltage less than a reference voltage for a delay period corresponding to a time it takes for a voltage at a selected node of said selected word line to fall to said reference voltage, said reference voltage being greater than said first voltage and less than said deselected word line voltage;

after said voltage reaches said reference voltage, generating a control signal for triggering biasing said selected word line with a selected word line voltage for performing said reading operation, said selected word line voltage being greater than said first voltage and less than said deselected word line voltage; and biasing said selected word line with said selected word line voltage responsive to said control signal.

13. The method of claim 12, wherein said control signal generating step comprises:

providing a reference block of memory cells comprising a plurality of reference word lines;

detecting a reference word line voltage from a word line in said reference block; and comparing a reference word line voltage with said reference voltage.

14. The method of claim 13, further comprising the steps of:

providing results of said comparison to a positive edge trigger circuit; and latching an output of said positive edge trigger circuit to provide said control signal.

15. The method of claim 13, further comprising the steps of:

biasing said deselected reference word lines from said reference block with said deselected word line voltage, wherein voltage from at least some of said deselected reference word lines is coupled to a selected reference word line, wherein said reference word line voltage is detected from said selected reference word line.

16. The method of claim 15, wherein the selected reference word line and said selected word line are maintained at said first voltage during said delay period and said reference voltage is substantially equal to said selected word line voltage.

* * * * *